United States Patent

Huang et al.

(10) Patent No.: US 9,823,961 B1
(45) Date of Patent: Nov. 21, 2017

(54) MEMORY CONTROLLER AND OPERATING METHOD THEREOF

(71) Applicant: MACRONIX INTERNATIONAL CO., LTD., Hsinchu (TW)

(72) Inventors: Yu-Ming Huang, Taipei (TW); Yu-Ming Chang, Pingtung County (TW); Hsi-Chia Chang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/376,715

(22) Filed: Dec. 13, 2016

(51) Int. Cl.
| | |
|---|---|
| *G11C 16/06* | (2006.01) |
| *G06F 11/10* | (2006.01) |
| *G11C 29/52* | (2006.01) |
| *G06F 3/06* | (2006.01) |

(52) U.S. Cl.
CPC ........ *G06F 11/1044* (2013.01); *G06F 3/0616* (2013.01); *G06F 3/0649* (2013.01); *G06F 3/0673* (2013.01); *G11C 29/52* (2013.01)

(58) Field of Classification Search
CPC ..... G11C 16/10; G11C 16/26; G11C 16/3459; G11C 11/5635; G11C 11/5642; G11C 16/00; G11C 16/0483; G11C 16/08; G11C 2029/0407; G11C 29/06; G11C 29/16; G11C 29/26; G11C 29/44; G11C 7/18; G11C 11/5628
USPC ......... 365/185.03, 151, 178, 185.18, 185.19, 365/185.22, 185.33, 218, 49.15; 711/103, 711/E12.01, E12.008, 154, 170
See application file for complete search history.

(56) References Cited

U.S. PATENT DOCUMENTS

| | | |
|---|---|---|
| 2009/0172247 A1 * | 7/2009 | Bar-Or .................. G11C 16/10 711/103 |
| 2013/0283128 A1 | 10/2013 | Lee et al. |
| 2015/0012795 A1 | 1/2015 | Sakaue |
| 2015/0248332 A1 | 9/2015 | Ordentlich et al. |
| 2015/0309875 A1 | 10/2015 | Mittelholzer et al. |
| 2016/0162352 A1 | 6/2016 | Singhai et al. |

* cited by examiner

*Primary Examiner* — Thong Q Lee
(74) *Attorney, Agent, or Firm* — McClure, Qualey & Rodack, LLP

(57) ABSTRACT

An operating method of a memory controller, for a memory device including a plurality of cells, includes steps of: checking states of the cells; marking at least one specific bit-channel according to the states of the cells; and performing an uneven wear leveling scheme on at least one target cell storing messages from the at least one specific bit-channel, such that the wear level of the at least one target cell is different from other cells.

18 Claims, 2 Drawing Sheets

G

3rd row →

```
1 0 0 0 0 0 0 0
1 0 0 0 1 0 0 0
1 0 1 0 0 0 0 0
1 0 1 0 1 0 1 0
1 1 0 0 0 0 0 0
1 1 0 0 1 1 0 0
1 1 1 1 0 0 0 0
1 1 1 1 1 1 1 1
```

MEMORY CONTROLLER AND OPERATING METHOD THEREOF

TECHNICAL FIELD

The disclosure relates in general to a memory controller and an operating method thereof.

BACKGROUND

There are several techniques for prolonging the effective lifetime of a storage media. For instance, an error-correcting code (ECC) can be used for each page or sector in order to correct errors.

ECC encodes data in a way that a decoder can identify and correct errors in the data. For example, data are encoded by adding a number of redundant bits to them. When the data is reconstructed, the decoder examines the encoded message to check for any errors.

Traditionally, in order to simplify the design of ECC and to improve the error-correcting performance in most storage applications, the states of cells in memory are assumed to be independent and identically distributed (i.i.d.). However, if the cell states vary with use (e.g., Programing/Erasure (P/E) cycles applied to the cells). The error-correcting performance would decrease In addition, the threshold voltage (Vt) distributions of storage media such as NAND flash memory are different for every single cell due to disturb, random telegraph noise, and charge leakage and thus the i.i.d. property is not appropriate in real case, which leads to performance loss.

SUMMARY

One of the purposes of the present disclosure is to provide a memory controller and an operating method thereof, utilizing proactive channel adjustment to arrange data to achieve an uneven and specific wear level distribution for the cells, thereby improving the error-correcting performance.

According to one embodiment, an operating method of a memory controller for a memory device including a plurality of cells is provided. The operating method includes steps of: checking states of the cells; marking at least one specific bit-channel according to the states of the cells; and performing an uneven wear leveling scheme on at least one target cell storing messages from the at least one specific bit-channel, such that the reliability of some cells are much better than others.

According to another embodiment, a memory controller is provided. The memory controller includes an interface and a processing circuitry. The interface is configured to communicate with a memory device including a plurality of cells. The processing circuitry couples to the interface and configured to: for the memory device, check states of the cells; mark at least one specific bit-channel according to the states of the cells; and perform an uneven wear leveling scheme on at least one target cell storing messages from the at least one specific bit-channel, such that the wear level of the at least one target cell is different from other cells.

Figure 1:
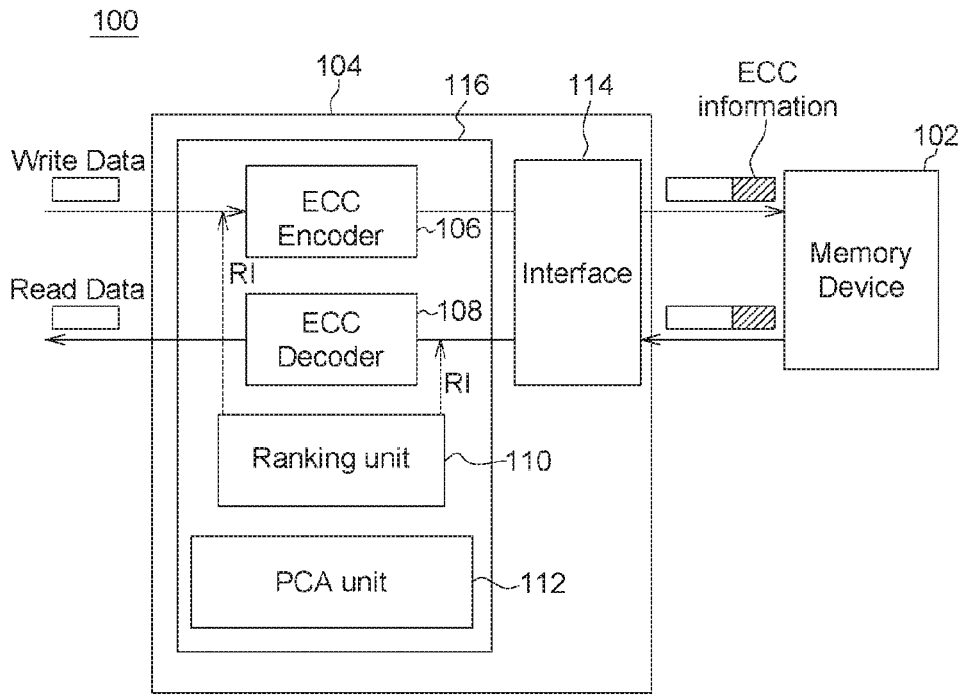
FIG. 1 shows an example block diagram of a memory system, in accordance with an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

A number of embodiments are disclosed below for elaborating the disclosure. However, the embodiments of the disclosure are for detailed descriptions only, not for limiting the scope of protection of the disclosure. Furthermore, secondary or less relevant elements are omitted in the accompanying diagrams of the embodiments for highlighting the technical features of the disclosure.

FIG. 1 shows an example block diagram of a memory system 100, in accordance with an embodiment of the present disclosure. The memory system 100 includes a memory device 102 and a memory controller 104. The memory device 102 is, for example, a NAND flash memory, although any other suitable type of memory, such as NOR flash memory, phase change RAM (PRAM), Ferroelectric RAM (FRAM), magnetic RAM (MRAM) and/or Dynamic RAM (DRAM), can also be used. The memory controller 104 can be implemented, for example, using software running on one or more processors, hardware (e.g., logic circuits), or the combination thereof.

The memory device 102 includes a plurality of cells for storing data. Given that a cell has a binary bit X as input and the output Y. In other words, we program a binary bit X to the cell, and we would like to read the binary bit X out when uses need to know the value. In additional, for advanced error-correcting, the output value is a (log) likelihood ratio, which is a ratio of probability, instead of a binary bit. The cell can be deemed as a channel derived from simulated or measured error patterns between the input bit X and the output bit Y.

The memory controller 104 includes an interface 114 and a processing circuitry 116. The interface 114 is configured to communicate with the memory device 102. For example, the interface 114 includes one or more signal ports for transmitting data to be written in or read from the memory device 102.

The processing circuitry 116 couples to the interface 114. The processing circuitry 116 includes an ECC encoder 106, an ECC decoder 108, a ranking unit 110 and a Proactive Channel Adjustment (PCA) unit 112. The ECC encoder 106 encodes data with error-correcting code (ECC) information before written in the memory device 102. The ECC decoder 108 decodes the ECC information of the data read from the memory device 102.

In an embodiment of the present disclosure, the ECC function of the memory controller 104 is implemented by polar code. Polar code is an advanced ECC. If a polar code has sufficiently long code word length, the bit-channels, i.e., virtual channel realizations which include encoding, real channel, and decoding parts, seen by individual input bits through the polar code transformation may polarize to be either highly reliable or highly unreliable, which is known as channel polarization. This suggests the construction of polar codes as follows: put the information bits over the set of good bit-channels, i.e. almost noise-less channels, while put the frozen bits over the set of bad bit-channels, i.e. almost pure-noise channels.

Due to the property of channel polarization, the correction capability of polar code mainly depends on the ranking determined based on the states of the cells. Here, the order derived according to the reliability of bit-channels is referred to as "ranking", which is also known as "code construction".

The ranking unit 110 records the ranking information RI of the bit-channels, which is provided to the ECC encoder 106/ECC decoder 108 to identify the positions of the information bits and the frozen bits in a polar code. As shown in FIG. 1, the ECC encoder 106 may refer the ranking information RI to encode the write data, and the ECC decoder 108 may refer the ranking information RI to decode the data read from the memory device 102.

Traditionally, the ranking of the bit-channels might change with the wear level of the cells. The term "wear level" may refer to a measure of the amount of use of the cells, which can be quantized as, for example, the number of P/E cycles.

To avoid misusing bit-channels getting worse to carry information bits and thus reducing the error-correcting performance, one solution is to maintain several rankings (also called "code constructions") in advance, and adaptively switch the rankings for every certain number of P/E cycles. However, the hardware overhead to implement different rankings is relatively high.

According to the present disclosure, the PCA unit 112 is provided to address the abovementioned issues. The PCA unit 112 is configured to perform an uneven wear leveling scheme according to the states of the cells, such that the wear level of at least one target cell is different from other cells. In this way, the impact of cell wearing can be alleviated, such that the ranking of the bit-channels can be kept the same and not required to be changed with use (e.g., P/E cycles). For example, the PCA unit 112 may perform the uneven wear leveling scheme on at least one target cell to make a ranking of the bit-channels match only one code construction of polar code.

In an embodiment, the uneven wear leveling scheme includes applying respective different number of P/E cycles to the at least one target cell and the other cells. The number of P/E cycles applied to the at least one target cell is, for example, less than the number of P/E cycles applied to the other cells.

To adjust the number of P/E cycles applied on the cells, the PCA unit 112 may map the logical address of the target cell to at least one physical memory region other than an original physical memory region of the target cell in the memory device 102. For example, the PCA unit 112 may use one or more caches for the target cell to average/reduce the P/E cycles applied on the target cell.

Figure 2A:
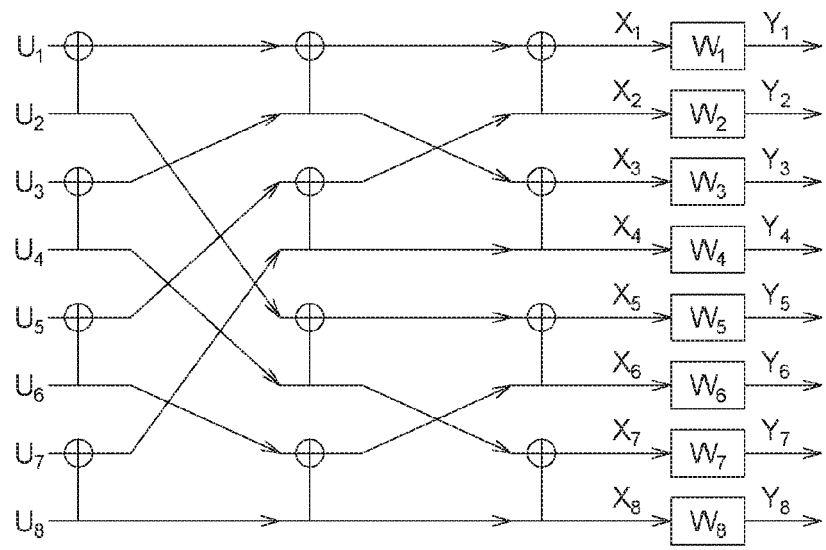
FIG. 2A shows an example polar code transformation.
Figures 2B, 3:
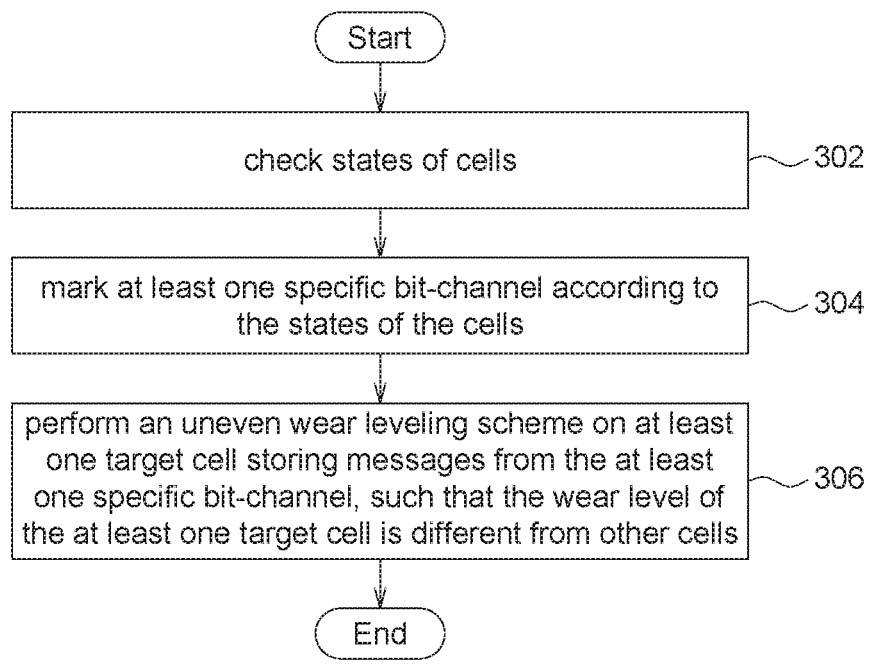
FIG. 2B shows a generator matrix of the polar code transformation shown in FIG. 2A.
FIG. 3 is an example flow chart illustrating the operating method of the memory controller, in accordance with an embodiment of the present disclosure.

FIG. 2A shows an example polar code transformation. FIG. 2B shows a generator matrix G of the polar code transformation shown in FIG. 2A. In this example, the code word length N of the polar code is 8 (bits).

As shown, a set of input bits U ($U_1$-$U_8$) are passed through the polar transformation from the left to the right to form the code word X ($X_1$-$X_8$). The code word X is then inputted to a set of cells W ($W_1$-$W_8$). The output of the cells W ($W_1$-$W_8$) is represented as Y ($Y_1$-$Y_8$). Note that U and X are binary bits and Y is a binary/non-binary value when hard/soft information is considered.

The generator matrix G is described as an N×N matrix (N=8 in this example), which transforms the input data U into the code word X=UG.

The i-th row of the generator matrix G indicates that the i-th input bit $U_i$ will be stored in which cell(s). For example, according to the 3rd row of the generator matrix G, it implies that the input bit $U_3$ will be stored in the cells $W_1$ and $W_3$, and the bit-channel seen by input bit $U_3$ is defined by the transformation between the input bit $U_3$ and the relating outputs $Y_1$ and $Y_3$ of the cells $W_1$ and $W_3$ (bit channel of $U_3$: $U_3 \rightarrow (Y_1, Y_3)$). Likewise, the bit-channel seen by input bit $U_4$ is defined by the transformation between the input bit $U_4$ and the relating outputs $Y_1$, $Y_3$, $Y_5$ and $Y_7$ (bit channel of $U_4$: $U_4 \rightarrow (Y_1, Y_3, Y_5, Y_7)$).

Typically, the cells $W_1$-$W_8$ are assumed to be i.i.d. Under the assumption, the ranking of the bit-channels can be derived as [$U_8$, $U_7$, $U_6$, $U_4$, $U_5$, $U_3$, $U_2$, $U_1$], which is a sequence for U in reliable order. That is, the reliability of the bit-channels of the input bits $U_4$, $U_6$, $U_7$ and $U_8$ are more reliable than that of the input bits $U_1$, $U_2$, $U_3$ and $U_5$. In such situation, consider the information length (data length) is 4, the input bits $U_4$, $U_6$, $U_7$, $U_8$ are preferably selected as information bits and the others are preferably selected as frozen bits. The values of the frozen bits are known to the receiver beforehand.

In an embodiment, the PCA unit 112 may manage the P/E cycles of each cell, so that the set of bit-channels carrying the information bits can be keep the same, namely, some bit-channels (e.g., the bit-channels of input bits $U_4$, $U_6$, $U_7$, $U_8$) always transmit the information bits and the others (e.g., the bit-channels of input bits $U_1$, $U_2$, $U_3$ and $U_5$) always transmits the frozen bits.

Specifically, as the number of P/E cycles increases, some cells might get worse than others, such that some bit-channels become less reliable and fail to carry information bits again. In order to utilize the same set of bit-channels to transmit information bits, the reliability of some bit-channels are required to be improved.

For example, to improve the reliability of the bit-channel of the input bit $U_4$, the PCA unit 112 may reduce the number of P/E cycles applied on the cells $W_1$, $W_3$, $W_5$ and $W_7$ by some management techniques, such as mapping the logical address of each of the cells $W_1$, $W_3$, $W_5$ and $W_7$ to one or more new physical addresses, so that the P/E cycles can be applied to different physical memory regions (e.g., caches). Note that the effect is not obvious in such small code length (i.e., N=8), the reason why we adopt this small code length case is to help readers understand the idea. That is, it works much better when the code length is much larger than this toy example's.

In the context of the present disclosure, a bit-channel (e.g. the bit-channel of the input bit $U_4$) to be improved is called specific bit-channel. Once the specific bit-channel is determined, the corresponding one or more target cells to be adjusted are determined accordingly.

In an embodiment, the specific bit-channel can be determined by comparing two or more rankings.

Specifically, due to the phenomenon of cell wearing, the ranking of bit-channels would be changed. Taking a 32-bit polar code with 23 information bits and 9 frozen bits as an example, the ranking of the bit-channels of the polar code might change from a first ranking [$U_{31}$, $U_{30}$, $U_{29}$, $U_{23}$, $U_{27}$, $U_{15}$, $U_{28}$, $U_{26}$, $U_{25}$, $U_{22}$, $U_{21}$, $U_{14}$, $U_{19}$, $U_{13}$, $U_{11}$, $U_7$, $U_{24}$, $U_{20}$, $U_{18}$, $U_{12}$, $U_{17}$, $U_{10}$, $U_9$, $U_6$, $U_5$, $U_3$, $U_{16}$, $U_8$, $U_4$, $U_2$, $U_1$, $U_0$] to a second ranking [$U_{31}$, $U_{30}$, $U_{29}$, $U_{23}$, $U_{27}$, $U_{15}$, $U_{28}$, $U_{26}$, $U_{25}$, $U_{22}$, $U_{21}$, $U_{14}$, $U_{19}$, $U_{13}$, $U_{11}$, $U_7$, $U_{24}$, $U_{20}$, $U_{18}$, $U_{12}$, $U_{17}$, $U_{10}$, $U_6$, $U_9$, $U_5$, $U_3$, $U_{16}$, $U_8$, $U_4$, $U_2$, $U_1$, $U_0$]

after a certain number of P/C cycles. If the first ranking is used for ECC encoding/decoding all the time and without using the proposed uneven wear leveling scheme, the ECC encoder 106/ECC decoder 108 will misuse the input bit $U_9$ with less bit-channel reliability (compared to the input bit $U_6$) as an information bit after the ranking has changed to the second one, resulting in lower error-correcting performance. The performance loss would be more severe when a larger code length is considered. For example, regarding to the application of flash-based storage devices, the code length of ECC is larger than 4096 in most cases.

To avoid such a situation, the PCA unit 112 may identify/mark which bit-channel (specific bit-channel) is getting worse reliability and fails to carry the information bit soon, and perform the uneven wear leveling scheme on one or more target cells to enhance the reliability of the specific bit-channel(s) according to the generator matrix G.

In an embodiment, the PCA unit 112 obtains a first ranking specifying the order of the reliability of the bit-channels adapted to a first range of P/E cycles (e.g., 0-10000) and a second ranking specifying the order of the reliability of the bit-channels adapted to a second range of P/E cycles (e.g., 10001-20000), and compares the first ranking and the second ranking to identify the at least one specific bit-channel from the bit-channels. In this example, the specific bit-channel can be recognized as a bit-channel that the ranking position moves from a position of an information bit (e.g., the position of $U_9$ in the first ranking) to a position of a frozen bit (e.g., the position of $U_9$ in the second ranking) when the first ranking is switched to the second ranking and without using the uneven wear leveling scheme. The first and second rankings can be obtained by, for example, an off test conducted by the manufacturers.

After the specific bit-channel is identified, the PCA unit 112 performs the uneven wear leveling scheme on the at least one target cell to keep the ranking position of the specific bit-channel remain the same, even when the number of P/E cycles is from the first range increased to the second range.

FIG. 3 is an example flow chart illustrating the operating method of the memory controller 104, in accordance with an embodiment of the present disclosure. The memory controller 104 executes the operating method for the memory device 102.

At step 302, the memory controller 104 checks the states of the cells. Each cell can be modeled by the error pattern between the input and the output of the cell. The state of the cell can be specified by the wear level (e.g., P/E cycles) applied on the cell. Generally, as the number of P/E cycles increases, the state of the cell degrades.

At step 304, the PCA unit 112 marks at least one specific bit-channel according to the states of the cells. The bit-channel is a channel seen by an input bit through a certain transformation to the corresponding output of the cells. Taking polar-code-based ECC as an example, the ECC encoder 106 performs an ECC encoding scheme of polar code to convert a plurality of input bits on the bit-channels into a code word through a polar code transformation specified by a generator matrix, such that the bit-channels are polarized with high/less reliability and carrying either information bits or frozen bits. Then, the PCA unit 112 determines the at least one target cell from the cells according to the generator matrix of the polar code transformation specifying the correspondence between the bit-channels and the cells.

The specific bit-channel is a bit-channel selected to be adjusted/improved the reliability. For example, if a bit-channel is getting worse reliability and fails to carry the information bit soon after a certain number of P/E cycles, the bit-channel will be marked as a specific bit-channel.

In an embodiment, if there are two or more rankings are known, the PCA unit 112 may compare these rankings to fine out at least one specific bit-channel whose ranking position may move from the position of the information bit to the position of the frozen bit when the current ranking is switched to the other one.

At step 306, the PCA unit 112 performs an uneven wear leveling scheme on at least one target cell storing messages from the at least one specific bit-channel, such that the wear level of the at least one target cell is different from other cells.

Taking FIGS. 2A and 2B as an example, if the bit-channel of the input bit $U_4$ is marked as the specific bit-channel by the PCA unit 112, the corresponding target cells storing messages from the bit-channel of the input bit $U_4$ are cell channels $W_1$, $W_3$, $W_5$ and $W_7$.

The uneven wear leveling scheme defined by the PCA unit 112 can be implement by various techniques, such as managing the P/E cycles applied on the cells, or any other techniques capable of adjusting states/wear level of the cells.

After processed by the uneven wear leveling scheme, the cells may present uneven and specific distribution, rather than i.i.d. With a proper design of the uneven and specific distribution, the ranking of the bit-channels is not easily to be changed, so the number of rankings required for the memory system 100 can be significantly reduced.

In summary, the proposed memory controller and operating method utilizes PCA to arrange data to achieve an uneven and specific wear level distribution, thereby improving the error-correcting performance.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operating method of a memory controller, comprising:

for a memory device including a plurality of cells,
checking states of the cells;
marking at least one specific bit-channel according to the states of the cells;
performing an uneven wear leveling scheme on at least one target cell storing messages from the at least one specific bit-channel, such that the wear level of the at least one target cell is different from other cells;
performing an Error-Correcting Code (ECC) encoding scheme of polar code to convert a plurality of input bits on the bit-channels into a code word through a polar code transformation; and
determining the at least one target cell from the cells according to a generator matrix of the polar code transformation specifying the correspondence between the bit-channels and the cells.

2. The operating method according to claim 1, wherein the uneven wear leveling scheme comprises:

applying respective different number of Programing/Erasure (P/E) cycles to the at least one target cell and the other cells.

3. The operating method according to claim 2, wherein the uneven wear leveling scheme further comprises:

mapping the logical address of the target cell to at least one physical memory region other than an original physical memory region of the target cell in the memory device.

4. The operating method according to claim 3, wherein the uneven wear leveling scheme further comprises:
using one or more caches for the target cell to average the P/E cycles applied on the target cell.

5. The operating method according to claim 2, wherein the number of P/E cycles applied to the at least one target cell is less than the number of P/E cycles applied to the other cells.

6. The operating method according to claim 1, further comprising:
obtaining a first ranking specifying the order of the reliability of the bit-channels adapted to a first range of P/E cycles and a second ranking specifying the order of the reliability of the bit-channels adapted to a second range of P/E cycles; and
comparing the first ranking and the second ranking to identify the at least one specific bit-channel from the bit-channels.

7. The operating method according to claim 6, wherein the at least one specific bit-channel is a bit-channel that the ranking position moves from a position of an information bit to a position of a frozen bit when the first ranking is switched to the second ranking and without using the uneven wear leveling scheme.

8. The operating method according to claim 7, further comprising:
performing the uneven wear leveling scheme on the at least one target cell to keep the ranking position of the at least one specific bit-channel remain the same even when the number of P/E cycles is from the first range cross to the second range.

9. The operating method according to claim 1, further comprising:
performing the uneven wear leveling scheme on the at least one target cell to make a ranking of the bit-channels match only one code construction of polar code.

10. A memory controller, comprising:
an interface configured to communicate with a memory device including a plurality of cells; and
a processing circuitry coupled to the interface and configured to:
for the memory device,
check states of the cells;
mark at least one specific bit-channel according to the states of the cells;
perform an uneven wear leveling scheme on at least one target cell storing messages from the at least one specific bit-channel, such that the wear level of the at least one target cell is different from other cells;
perform an Error-Correcting Code (ECC) encoding scheme of polar code to convert a plurality of input bits on the bit-channels into a code word through a polar code transformation; and
determine the at least one target cell from the cells according to a generator matrix of the polar code transformation specifying the correspondence between the bit-channels and the cells.

11. The memory controller according to claim 10, wherein the uneven wear leveling scheme comprises:
the processing circuitry applying respective different number of Programing/Erasure (P/E) cycles to the at least one target cell and the other cells.

12. The memory controller according to claim 11, wherein the uneven wear leveling scheme further comprises:
the processing circuitry mapping the logical address of the target cell to at least one physical memory region other than an original physical memory region of the target cell in the memory device.

13. The memory controller according to claim 12, wherein the uneven wear leveling scheme further comprises:
the processing circuitry using one or more caches for the target cell to average the P/E cycles applied on the target cell.

14. The memory controller according to claim 11, wherein the number of P/E cycles applied to the at least one target cell is less than the number of P/E cycles applied to the other cells.

15. The memory controller according to claim 10, wherein the processing circuitry is further configured to:
obtain a first ranking specifying the order of the reliability of the bit-channels adapted to a first range of P/E cycles and a second ranking specifying the order of the reliability of the bit-channels adapted to a second range of P/E cycles; and
compare the first ranking and the second ranking to identify the at least one specific bit-channel from the bit-channels.

16. The memory controller according to claim 15, wherein the at least one specific bit-channel is a bit-channel that the ranking position moves from a position of an information bit to a position of a frozen bit when the first ranking is switched to the second ranking and without using the uneven wear leveling scheme.

17. The memory controller according to claim 16, wherein the processing circuitry is further configured to:
perform the uneven wear leveling scheme on the at least one target cell to keep the ranking position of the at least one specific bit-channel remain the same even when the number of P/E cycles is from the first range cross to the second range.

18. The memory controller according to claim 10, wherein the processing circuitry is further configured to:
perform the uneven wear leveling scheme on the at least one target cell to make a ranking of the bit-channels match only one code construction of polar code.

* * * * *